United States Patent
Saito

(10) Patent No.: US 7,994,430 B2
(45) Date of Patent: Aug. 9, 2011

(54) MOUNTING STRUCTURE, ELECTRO-OPTICAL DEVICE, ELECTRONIC APPARATUS, AND METHOD OF PRODUCING THE MOUNTING STRUCTURE

(75) Inventor: Atsushi Saito, Chino (JP)

(73) Assignee: Epson Imaging Devices Corporation (JP)

( * ) Notice: Subject to any disclaimer, the term of this patent is extended or adjusted under 35 U.S.C. 154(b) by 1027 days.

(21) Appl. No.: 11/839,569

(22) Filed: Aug. 16, 2007

(65) Prior Publication Data

US 2008/0099233 A1    May 1, 2008

(30) Foreign Application Priority Data

Oct. 27, 2006 (JP) .................................. 2006-292173
Jun. 1, 2007 (JP) .................................. 2007-146544

(51) Int. Cl.
*H05K 1/16* (2006.01)

(52) U.S. Cl. ...................................... 174/260; 257/737

(58) Field of Classification Search ................ 174/260, 174/261, 267; 257/737
See application file for complete search history.

(56) References Cited

U.S. PATENT DOCUMENTS 6,897,568 B2 * 5/2005 Haimerl et al. ............... 257/779
7,321,169 B2 * 1/2008 Imaseki et al. ................ 257/773

FOREIGN PATENT DOCUMENTS

| JP | 2005-101527 | 4/2005 |
| JP | 2005-136402 | 5/2005 |
| JP | 2005-283852 | 10/2005 |
| JP | 2006-100505 | 4/2006 |
| JP | 2007-180166 | 7/2007 |

\* cited by examiner

*Primary Examiner* — Ishwarbhai B Patel
(74) *Attorney, Agent, or Firm* — Harness, Dickey & Pierce, P.L.C.

(57) ABSTRACT

A mounting structure includes a first electronic component, a second electronic component, and an adhesive. The first electronic component includes at least one protruding electrode including a protruding member and at least one electrically conductive layer. The protruding member is formed of resin. The at least one electrically conductive layer is disposed on the protruding member. The second electronic component has a facing electrode electrically conductively in contact with the at least one protruding electrode. The adhesive is used to adhere the first electronic component and the second electronic component to each other. The protruding member has a first area and a second area. The first area has the at least one electrically conductive layer provided thereon. The second area does not have the at least one electrically conductive layer provided thereon. The first area of the protruding member is squashed more than the second area.

10 Claims, 7 Drawing Sheets

MOUNTING STRUCTURE, ELECTRO-OPTICAL DEVICE, ELECTRONIC APPARATUS, AND METHOD OF PRODUCING THE MOUNTING STRUCTURE

The entire disclosure of Japanese Patent Application Nos. 2006-292173, filed Oct. 27, 2006 and 2007-146544, filed Jun. 1, 2007 are expressly incorporated by reference herein.

BACKGROUND

1. Technical Field

The present invention relates to a mounting structure, an electro-optical device, an electronic apparatus, and a method of producing the mounting structure. More particularly, the invention relates to a structure of a protruding electrode provided at an electronic component.

2. Related Art

In general, various electronic components, such as semiconductor devices, including a protruding electrode (bump electrode), provided on a surface of a substrate so as to protrude therefrom, are known. The protruding electrode is adhered to, for example, a substrate, at a side where mounting is performed, for electrical conduction. In general, a metallic bump electrode, formed by, for example, thickly plating a seed electrode with a metal (such as Au), is used as the protruding electrode. For example, a method of mounting a driving IC on a substrate of various display members is known as a mounting method using such a protruding electrode.

A proposal of using, as the above-described protruding electrode, a protruding electrode formed by forming a resinous protruding member on a substrate and forming an electrically conductive layer on a surface of the protruding member has been proposed (refer to, for example, JP-A-2005-136402 and JP-A-2005-101527 below). Compared to a related metallic bump electrode, this type of protruding electrode can use a thinner electrically conductive layer, so that fine patterning can be performed, thereby making it possible to reduce an electrode pitch. In addition, the use of a resinous protruding member makes it possible to ensure a stable contact pressure as a result of making use of elastic deformation of the protruding member, so that, compared to a related bump electrode, electrical reliability can be increased, etc.

A top portion of the protruding electrode discussed in each of JP-A-2005-136402 and JP-A-2005-101527 is squashed by a facing electrode during mounting. When a deformation amount of the protruding electrode is too large, for example, a crack occurs in the aforementioned resinous protruding member or the electrically conductive layer, formed on the protruding member. This results in variations in electrical conductivity of the protruding electrode and an increase in a resistance value, thereby reducing electrical reliability.

That is, in general, mounting is performed as a result of setting a compression force at the time of mounting in a range in which the protruding electrode does not crack. Since variations exist in, for example, the form of the protruding electrode, the elastic modulus of a constituent material, the mounting temperature, and the compression distribution, even if the mounting is performed under the previously set compression force, variations occur in the amount of deformation of the protruding electrode. Therefore, it is not possible to eliminate the possibility of, for example, the protruding electrode becoming cracked (as well as deformation of the electrically conductive layer resulting from variations and an increase in resistance. This also applies to the discussion below). To sufficiently reduce this possibility, it is necessary to set the compression force considerably lower than a limit value. However, when this is done, contact pressure or contact area may no longer be ensured due to an insufficient deformation amount of the protruding electrode. Therefore, in either case, variations or an increase in a conductive connection resistance occurs, thereby resulting in improper mounting in extreme cases.

SUMMARY

An advantage of some aspects of the invention is to provide a mounting structure, an electro-optical device, and an electronic apparatus, which have high electrical reliability as a result of restricting variations and an increase in connection resistance by reducing the possibility of a protruding electrode becoming cracked.

According to a first aspect of the invention, there is provided a mounting structure including a first electronic component, a second electronic component, and an adhesive. The first electronic component includes at least one protruding electrode including a protruding member and at least one electrically conductive layer. The protruding member is formed of resin. The at least one electrically conductive layer is disposed on the protruding member. The second electronic component has a facing electrode electrically conductively in contact with the at least one protruding electrode. The adhesive is used to adhere the first electronic component and the second electronic component to each other. The protruding member has a first area and a second area. The first area has the at least one electrically conductive layer provided thereon. The second area does not have the at least one electrically conductive layer provided thereon. The first area of the protruding member is squashed more than the second area.

According to this aspect of the invention, the first area, which corresponds to the protruding electrode, is set within a range in which the protruding electrode is not cracked when it is squashed until the difference between the heights of the first and second areas becomes zero. Therefore, even if the first area is squashed until the height difference becomes zero during mounting, the protruding electrode is not cracked. In addition, even in a state in which, due to the compression force being excessively large or due to the elastic modulus of the protruding electrode being excessively small, the top portion of protruding electrode is squashed to a point beyond which the height difference is eliminated, the second area is also pressed at the same time. Therefore, an increase in the deformation amount of the first area is restricted, and a change in the form of the first area is restricted as a result of the support by the second area. As a result, it is possible to reduce, for example, cracking of the protruding electrode. Consequently, it is possible to restrict, for example, variations and an increase in connection resistance resulting from, for example, cracking of the protruding electrode, so that electrical reliability can be increased.

That is, according to the aspect of the invention, the protruding member has a first area, having the electrically conductive layer provided thereon, and a second area, not having the electrically conductive layer provided thereon. The first area of the protruding member is squashed by a larger amount than the second area, so that, when the first area is squashed during mounting, the first area is easily squashed and squashing force is reduced as a result of the support by the second area. Therefore, for example, the occurrence of cracking of the protruding electrode can be reduced. Consequently, for example, variations and an increase in connection resistance resulting from, for example, cracking caused by the protruding electrode being squashed more than is necessary are reduced. As a result, electrical reliability can be increased.

Here, an example of the protruding electrode including the protruding member having the first area and the second area has the following features. The protruding member includes a first portion and a second portion, which have semi-circular columnar shapes including a horizontal axial line and which are integrally formed adjacent to each other in the axial line direction. The diameter of the second portion is less than the diameter of the first portion. A cylindrical surface of the first portion of the protruding member constitutes the first area, and a cylindrical surface of the second portion constitutes the second area. The cylindrical surface of the first portion is provided with an electrically conductive layer.

In the mounting structure, it is preferable that, by squashing the first area of the protruding member more than the second area, the second area directly contact the second electronic component in a direction in which the at least one protruding electrode and the facing electrode contact each other.

According to this form, the squashed protruding electrode and the facing electrode contact each other, and the second area of the first electronic component is directly in contact with the second electronic component. Therefore, the pushing force can be opposed by the second area, so that unnecessary deformation of the protruding electrode during mounting is restricted. Consequently, it is possible to prevent, for example, cracking of the protruding electrode.

In this case, the second area of the protruding member of the protruding electrode is formed lower in height than the first area. According to this case, the second electronic component is in contact with and supported by the second area of the protruding member, so that deformation, itself, of the first area of the protruding member of the protruding electrode is also restricted. Therefore, it is possible to more reliably prevent variations and an increase in resistance resulting from, for example, cracking.

In addition, in the mounting structure, it is preferable that the at least one protruding electrode include a plurality of protruding electrodes, the at least one electrically conductive layer include a plurality of electrically conductive layers, the first electronic component include the plurality of protruding electrodes, the plurality of protruding electrodes include the common protruding member and the plurality of electrically conductive layers provided at the first area of the common protruding member so as to be separated from each other by the second areas. According to this form, a plurality of protruding electrodes and second areas are alternately disposed adjacent to each other. Therefore, even if an excessive compression force is applied, or the elastic modulus of the protruding electrodes is insufficient, the second areas are sufficiently effective in supporting the second electronic component. Therefore, for example, cracking of the protruding electrodes occurs rarely.

Further, in the mounting structure, it is preferable that there be a difference between the height of the first area of the protruding electrode and the height of the second area which is less than the height of the first area, and the height difference be set in a range in which the protruding electrode is not cracked when a top portion of the protruding electrode is squashed from above until there is no height difference at a softening temperature before hardening of the adhesive.

According to a second aspect of the invention, there is provided an electro-optical device including an electronic component, an electro-optical panel, and an adhesive. The electronic component includes at least one protruding electrode including a protruding member and at least one electrically conductive layer. The protruding member is formed of resin. The at least one electrically conductive layer is disposed on the protruding member. The electro-optical panel has a facing electrode electrically conductively in contact with the at least one protruding electrode. The adhesive is used to adhere the electronic component and the electro-optical panel to each other. The protruding member has a first area and a second area. The first area has the at least one electrically conductive layer provided thereon. The second area does not have the at least one electrically conductive layer provided thereon. The first area of the protruding member is squashed more than the second area.

In the electro-optical device, it is preferable that, by squashing the first area of the protruding member more than the second area, the second area directly contacts the electro-optical panel in a direction in which the at least one protruding electrode and the facing electrode contact each other.

In addition, in the electro-optical device, it is preferable that the at least one protruding electrode include a plurality of protruding electrodes, the at least one electrically conductive layer include a plurality of electrically conductive layers, the electronic component include the plurality of protruding electrodes, the plurality of protruding electrodes include the common protruding member and the plurality of electrically conductive layers provided at the first area of the common protruding member so as to be separated from each other by the second areas.

Further, in the electro-optical device, it is preferable that there be a difference between the height of the first area of the protruding electrode and the height of the second area which is less than the height of the first area, and the height difference be set in a range in which the protruding electrode is not cracked when a top portion of the protruding electrode is squashed from above until there is no height difference at a softening temperature before hardening of the adhesive.

Examples of electro-optical panels include a liquid crystal panel, an electrophoretic panel, and an organic luminescence panel. In particular, when the semiconductor device is mounted to a panel using a hard substrate, such as a glass substrate, deformation of a connecting pad, formed on the hard substrate, cannot be expected. Therefore, it is significant to use the protruding electrode including the resinous protruding member and provided at the semiconductor device.

According to a third aspect of the invention, there is provided an electronic apparatus including any one of the above-described mounting structures. In addition, according to a fourth aspect of the invention, there is provided an electronic apparatus including any one of the above-described electro-optical devices. Examples of electronic apparatuses include an image display apparatus (such as a monitor or a television receiver), an image projection apparatus (such as a projector), an electronic clock, a cellular phone, a computer apparatus, and a portable information terminal.

According to a fifth aspect of the invention, there is provided a method of producing a mounting structure including a first electronic component and a second electronic component. The first electronic component includes a protruding electrode including a protruding member and an electrically conductive layer. The protruding member is formed of resin. The electrically conductive layer is disposed on the protruding member. The second electronic component has a facing electrode electrically conductively in contact with the protruding electrode. The method includes at least forming the protruding electrode at the first electronic component, and mounting the first electronic component to the second electronic component. In forming the protruding electrode, the protruding member is formed so as to have a first area, at which the electrically conductive layer is to be provided, and a second area, at which the electrically conductive layer is not to be provided, and the electrically conductive layer is formed on the first area, so that the protruding electrode is formed. In the mounting structure, the first area, where the protruding electrode is provided, is brought into contact with the facing electrode, the first area is set in a state in which the first area is squashed more than the second area, and, in this state, an adhesive is hardened.

BRIEF DESCRIPTION OF THE DRAWINGS

The invention will be described with reference to the accompanying drawings, wherein like numbers reference like elements.

DESCRIPTION OF EXEMPLARY EMBODIMENTS

Structure of Electronic Component (Semiconductor Device)

Figure 1A:
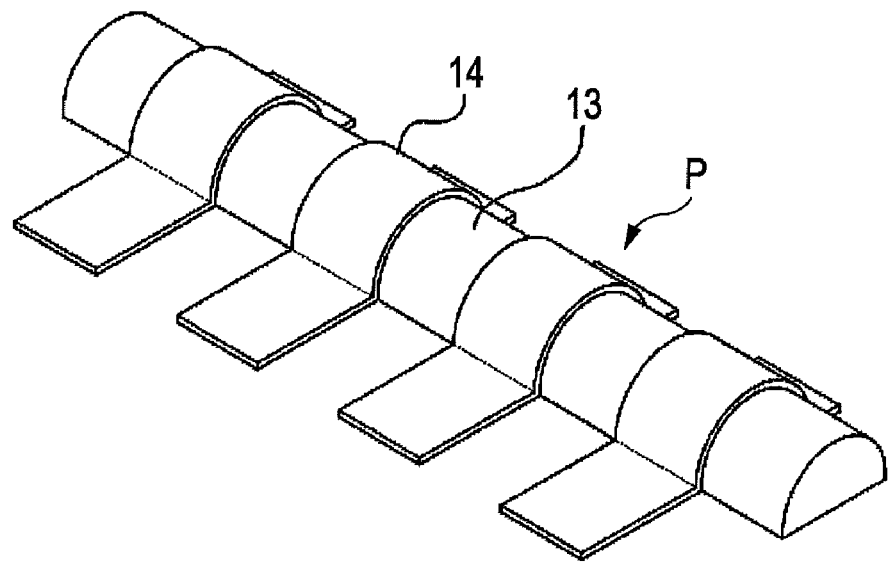
FIG. 1A is a schematic perspective of a structure during when formation areas of protruding electrodes of an electronic component (semiconductor device) according to an embodiment of the invention are being produced.
Figure 1B:
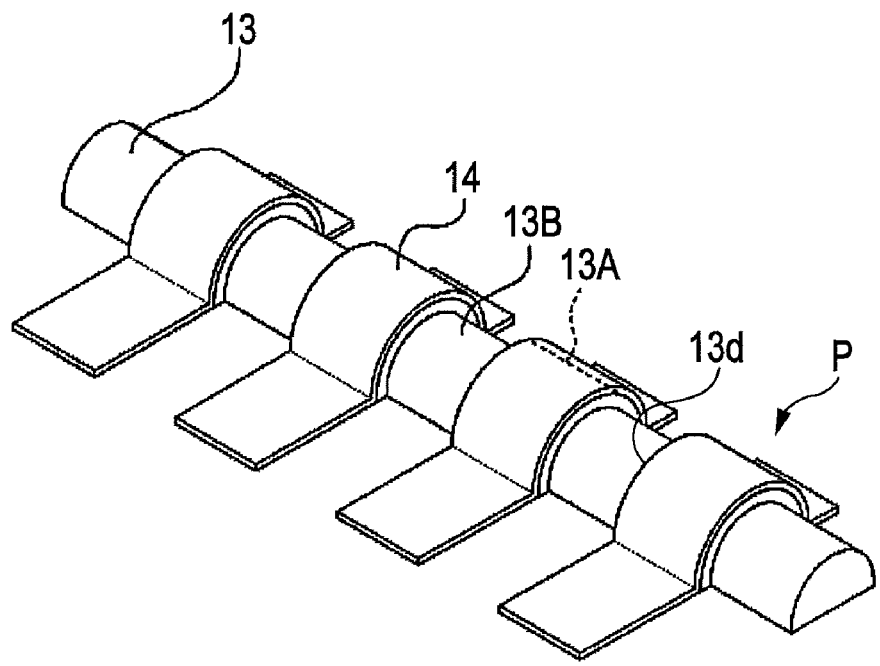
FIG. 1B is a schematic perspective view of the structure after completing the production of the formation areas of the protruding electrodes.
Figure 2:
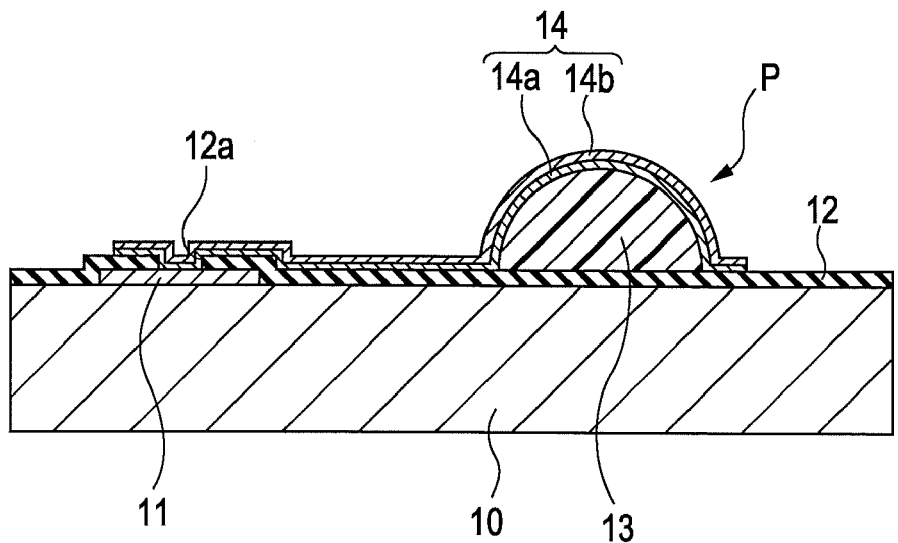
FIG. 2 is a vertical sectional view taken along a direction of extension of electrically conductive layers of the protruding electrodes.
Figure 3:
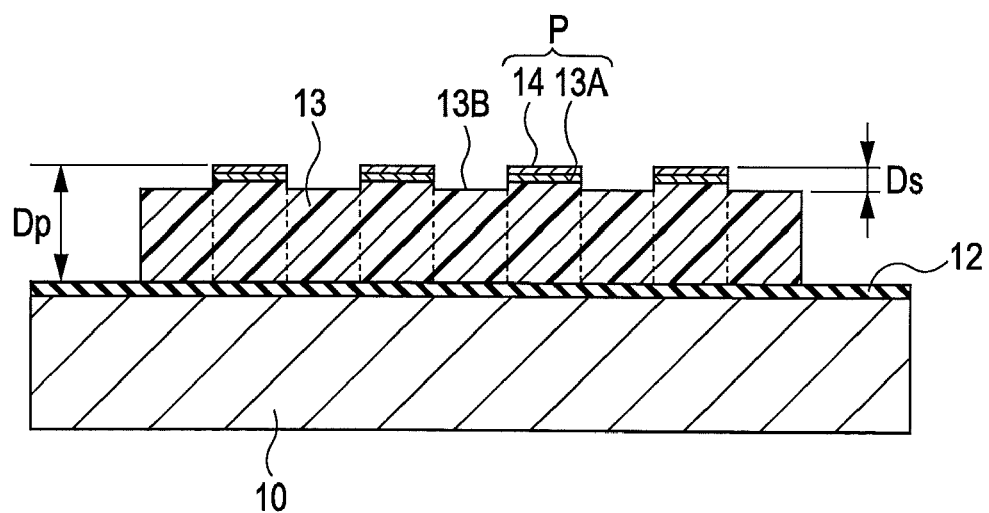
FIG. 3 is a vertical sectional view taken along a direction of arrangement of the electrically conductive layers of the protruding electrodes.

Next, embodiments of the invention will be described in detail with reference to the attached drawings. FIGS. 1A and 1B are schematic perspective views of protruding electrodes provided at an electronic component, or a semiconductor device, according to an embodiment. FIG. 2 is a partial vertical sectional view of the protruding electrode. FIG. 3 is a vertical sectional view taken along a direction of extension of a protruding member where the protruding electrodes are provided.

According to the embodiment, as shown in FIG. 2, base electrodes 11 and an insulating layer 12 are formed on a surface of a substrate 10, such as a semiconductor substrate, formed of, for example, a single crystal silicon. The base electrodes 11 are formed of, for example, aluminum. The insulating layer 12 has an opening 12a where a portion of each base electrode 11 is exposed, and is formed of, for example, silicon oxide or silicon nitride. Protruding electrodes P are formed on the insulating layer 12, and include a protruding member 13 and electrically conductive layers 14.

The protruding member 13, formed of resin, is formed on the insulating layer 12 in an area where each base electrode 11 and the opening 12a are not provided. The protruding member 13 may have any shape that allows it to protrude from the surface of the substrate 10. However, in the illustrated embodiment, as shown in FIG. 1, the protruding member 13 has a shape extending in a predetermined direction, more specifically, a semi-circular columnar shape including an axial line provided along the surface of the substrate 10. The protruding member 13 may be formed of various types of resin, such as acrylic resin, phenol resin, silicone resin, polyimide resin, silicone modification polyimide resin, or epoxy resin. In particular, it is desirable that the protruding member 13 be formed of photosensitive resin including the aforementioned various materials. As photosensitive resin, it is desirable to use acrylic photosensitive resin whose form can be controlled by adjusting an exposure condition. Further, it is desirable that the surface of the protruding member be formed into a rough surface to increase its adhesion with the electrically conductive layers 14 (described later).

The amount of protrusion of the protruding member 13 is set as appropriate in accordance with, for example, characteristics of a mounting portion and a mounting method. However, in general, it is set in the range of from 5 μm to 1000 μm. In terms of a semiconductor device, it is desirable to set it in the range of from 5 μm to 50 μm, and, in particular, in the range on the order of from 10 μm to 20 μm.

The electrically conductive layers 14 are formed on the protruding member 13, extend up to the opening 12a, and are conductively connected to the base electrodes 11. Although, in general, the thickness of each electrically conductive layer 14 is in the range of from 100 nm to 1 μm, it is, in particular, desirable that the thickness be in the range of from 300 nm to 800 nm. According to the embodiment, each electrically conductive layer 14 is a laminated structure including two layers, an underlying layer 14a and a surface electrically conductive layer 14b.

Here, although the material of each underlying layer 14a is not limited to an electrically conductive material, it is desirable that each underlying layer 14a be formed of the electrically conductive material. Examples of the electrically conductive material include TiW, Cu, Cr, Ni, Pd, Ti, W, and NiV Each underlying layer 14a is provided primarily to increase the adherence with the resin of the protruding member. It is more desirable for each underlying layer 14a to be formed of, for example, TiW to function as a diffusion prevention layer that prevents diffusion of the metallic material (such as aluminum) of the base electrodes 11. It is desirable for the thickness of each underlying layer 14a to be in the range on the order of from 100 nm to 150 nm. Although, according to the embodiment, each electrically conductive layer 14 has a two-layer structure, it may obviously have a single-layer structure (such as a single metallic layer structure).

Each surface electrically conductive layer 14b is formed of an electrically conductive material having suitable functions as an electrode surface, such as having a small contact resistance with respect to a facing electrode (described later). Examples of such an electrically conductive material include Au, Ag, Cu, and Pt. It is further desirable that each surface electrically conductive layer 14b be formed of a material (such as Au or Pt) having good corrosion resistance in addition to the aforementioned electrically conductive connection performance. It is desirable that the thickness of each surface electrically conductive layer 14b be in the range on the order of from 300 nm to 600 nm.

A plurality of protruding electrodes P are arranged and formed on a mounting surface of the electronic component (semiconductor device). In the case of the embodiment, a plurality of electrically conductive layers 14 are arranged on the common protruding member 13 in the direction of extension of the common protruding member 13. The electrically conductive layers 14 are connected in electrically conduction with different corresponding base electrodes 11, extend along the top portions of the protruding member 13, and are separated from each other on the protruding member 13.

According to the embodiment, the protruding member 13 has two types of top portions, that is, first top portions 13A and second top portions 13B. Each second top portion 13B is formed lower in height than each first top portion 13A. Here, the two types of top portions basically define a shape of the protrusion. In the illustrated embodiment, the protruding member 13, itself, including the first top portions 13A and the second top portions 13B is integrally formed, but has different top portions having different heights. In the case of the illustrated embodiment, the first top portions 13A and the second top portions 13B are alternately disposed at the protruding member 13 in the direction of extension of the protruding member 13. In addition, each electrically conductive layer 14, formed on the corresponding first top portion 13A, constitutes the top portion of the corresponding protruding electrode P.

Here, FIG. 1A is an external view of a structure during manufacturing immediately after the electrically conductive layers 14 are formed after forming the protruding member 13. FIG. 1B shows a completed structure after providing a predetermined height difference as a result of forming the second top portions 13B (provided at the exposed portions) lower in height than the top portions of the protruding electrodes P (that is, the top portions of the electrically conductive layers 14 provided on the first top portions 13A) by etching exposed portions of the protruding member 13 with the electrically conductive layers 14 as masks. That is, etching the protruding member 13 from the state shown in FIG. 1A, recessed grooves 13d are formed in portions other than the top portions of the protruding electrodes P, so that the second top portions 13B, corresponding to internal surfaces defining the recessed grooves 13d, are provided.

In the illustrated embodiment, the plurality of recessed grooves 13d, which are separated from each other in the axial line direction (extension direction) of the semi-circular columnar protruding member 13 including a horizontal axial line, are formed. By this, the protruding member 13 is provided with first semi-circular columnar portions and second semi-circular columnar portions having a diameter that is less than the diameter of the first semi-circular columnar portions. In addition, the first portions and the second portions are integrally formed adjacent to each other. Further, the electrically conductive layers 14 are formed on the cylindrical surfaces of the first portions, so that the topmost portions of the cylindrical surfaces of the first portions (that is, ridges extending in straight lines in the axial line direction) correspond to the first top portions, and the surfaces of the electrically conductive layers 14, provided on the first top portions, correspond to the top portions of the protruding electrodes P. Still further, the topmost portions of the cylindrical surfaces of the second portions (that is, ridges extending in straight lines in the axial line direction) correspond to the second top portions 13B. Still further, as a whole, the first portions and the second portions are alternately arranged in the axial line direction (extension direction).

FIG. 3 is a sectional view taken along the direction of extension of the protruding member 13. As mentioned above, the electrically conductive layers 14 are formed on the first top portions 13A of the protruding member 13 to form the top portions of the protruding electrodes P. The second top portions 13B are lower in height than the top portions of the protruding electrodes P by a height difference Ds. The height difference Ds is set within a range in which a crack does not occur in the protruding electrodes P, that is, in a range in which a crack does not occur in the first top portions 13A, where the protruding electrodes P are formed, or in the electrically conductive layers 14 (formed on the first top portions) when the top portions of the protruding electrodes P are squashed until the height difference Ds is eliminated at a softening temperature before an adhesive 30 (described below) is hardened (that is, at a temperature at which the unhardened adhesive 30 is softened during mounting), or at a temperature that is the same as that in a mounting process (described below) (that is, at a temperature of the protruding electrodes P in the mounting process).

That is, the electronic component includes the protruding member 13 including the first top portions 13A (having electrically conductive layers 14 formed thereon) and the second top portions 13B (not having electrically conductive layers formed thereon and being lower in height than the first top portions 13A). When the electronic component comes into contact with and is squashed by a different electronic component, which the protruding electrodes P face, or facing electrodes of an electro-optical panel 20S, the first top portions 13A that are higher in height are squashed before the second top portions 13B. When a squashing amount of the first top portions 13A becomes a proper amount, the second top portions come directly into contact with the different electronic component or the electro-optical panel 20S facing the second top portions. Here, the different electronic component or the electro-optical panel 20S comes into contact with the second top portions so that the second top portions are squashed by a smaller amount than the first top portions 13A. This makes it possible to oppose the squashing force by the first top portions 13A and the second to portions 13B, thereby restricting excessive deformation of the protruding electrodes P during the mounting. Therefore, it is possible to prevent, for example, cracking of the protruding electrodes.

In the embodiment, the height difference Ds between the first top portions 13A and the second top portions 13B of the protruding member 13 is less than or equal to 20% to 50% of a protrusion amount Dp of the protruding electrodes P (that is, the topmost portions of the electrically conductive layers 14 provided on the first top portions 13A), and, in particular, less than or equal to 30% to 40%. For example, when the protrusion amount Dp of the protruding electrodes P is 10 µm, the height difference Ds is in the range less than or equal to 4 µm (when a limiting deformation amount Dt (described below) is 4.5 µm). When the protruding amount Dp is 20 µm, the height difference Ds is in the range less than or equal to 7 µm (when the limiting deformation amount (described below) is 7.5 µm).

Method of Producing Electronic Component (Semiconductor Device)

Next, a method of producing the above-described electronic component (semiconductor device) according to an embodiment will be described in detail. As illustrated in FIG. 2, in the producing method according to the embodiment, base electrodes 11, formed of, for example, aluminum, are formed on the surface of a substrate 10 by, for example, evaporation or sputtering. The base electrodes 11 can be formed along with, for example, various wires, provided on the substrate 10, by patterning, such as etching. Thereafter, an insulating layer 12 is formed on the substrate 10 and the base electrodes 11 by, for example, the CVD method or sputtering, and an opening 12a for exposing the base electrodes 11 is formed by patterning.

Thereafter, photosensitive resin (not shown) is applied to the insulating layer 12, and is subjected to exposure using an exposure mask (not shown) having an opening. Then, a protruding member 13 formed with the shape of each figure is formed by development. Here, the use of a photosensitive material (such as acrylic photosensitive resin) as the aforementioned photosensitive resin, in which the thickness of a residual portion can be adjusted by controlling exposure amount, makes the following possible. That is, the protruding member 13 having a narrow upper portion when viewed in its direction of extension as illustrated can be easily formed using the exposure mask having a simple opening shape.

Here, it is desirable to roughen the surface of the protruding member 13. The surface of the protruding member 13 can be roughened by, for example, plasma processing using oxygen gas. It is desirable that a surface roughness Ra of the protruding member 13 be in the range of from 50 nm to 500 nm, and, in particular, in the range on the order of from 100 nm to 150 nm.

Thereafter, electrically conductive layers 14 are formed on the protruding member 13. In the illustrated embodiment, underlying layers 14a and surface electrically conductive layers 14b are successively formed by evaporation or sputtering, and patterning. The underlying layers 14a and the surface electrically conductive layers 14b may be formed by plating (that is, electroless plating or electroplating). By this, the protruding electrodes P having the form shown in FIG. 1A are formed.

Figure 4:
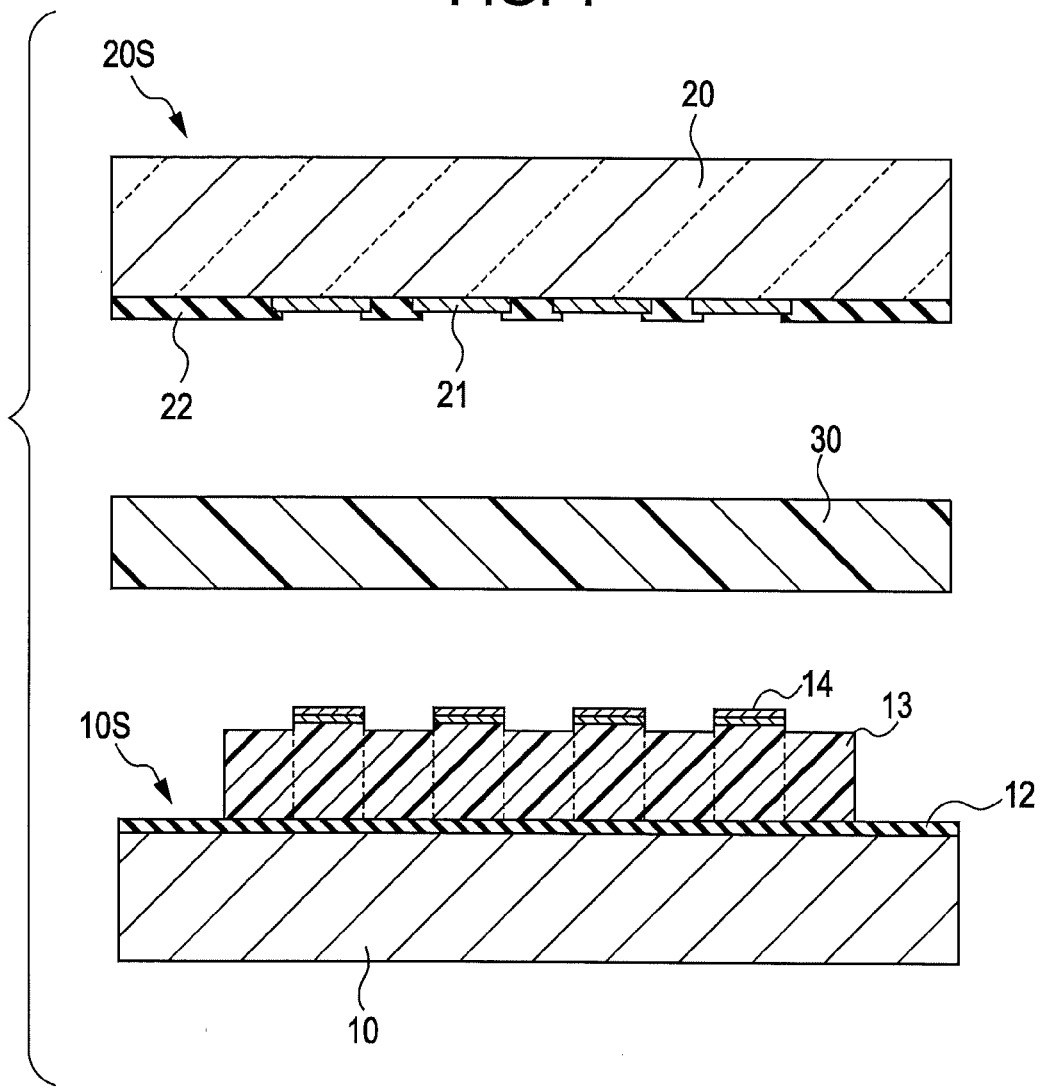
FIG. 4 is a sectional view showing a state before mounting in a mounting process for a mounting structure.

Next, using the electrically conductive layers 14, which have been patterned as illustrated in FIG. 1A, as masks, the protruding member 13 is etched by, for example, oxygen plasma processing, so that the aforementioned recessed grooves 13d are formed as illustrated in FIG. 1B. Forming the recessed grooves 13d produces the height difference Ds between the top portions of the protruding electrodes P and the second top portions 13B as illustrated in FIG. 3. That is, the height difference is produced between the exposed second top portions 13B and the first top portions 13A that are coated with the electrically conductive layers 14, by performing etching on the protruding member 13. As a result, the height difference Ds between the top portions of the protruding electrodes P and the second top portions 13B is produced. The aforementioned process corresponds to a protrusion-electrode formation process. A distinctive feature of the embodiment is that the height difference Ds is set in a predetermined range. This point will be described below Mounting Structure and Method of Producing the Mounting Structure FIG. 4 is a schematic sectional view of a state in which the electronic component according to the above-described embodiment or a semiconductor device 10S is mounted to a different electronic component or the electro-optical panel 20S. Here, the different electronic component or the electro-optical panel 20S includes a substrate 20 (formed of a hard material such as glass), facing electrodes 21 (formed on the substrate 20), and an insulating layer 22 (which exposes the facing electrodes 21 and, at the same time, covers the other portions).

When the electronic component 10 or the semiconductor device 10S is mounted to the different electronic component or the electro-optical panel 20S, an unhardened sheet (formed of an adhesive 30, such as thermosetting resin) is disposed between them. Then, while heating the electronic component 10 or the semiconductor device 10S, the different electronic component or the electro-optical panel 20S is compressed. When this is done, the adhesive 30 is softened by heat. At the aforementioned softening temperature or at the aforementioned temperature that is the same as that in the mounting process, the top portions of the protruding electrodes P are brought into contact with the facing electrodes 21, so that the top portions of the protruding electrodes P are squashed by compression force. Thereafter, when the adhesive 30 hardens, the electronic component or the semiconductor device 10S is adhered to the different electronic component or the electro-optical panel 20S. This causes an electrically conductive connection state between the protruding electrodes P and the facing electrodes 21 to be maintained. The aforementioned process corresponds to the mounting process. The aforementioned softening temperature or the temperature that is the same as that in the mounting process is ordinarily within the range of from 150° C. to 280° C.

Figure 5:
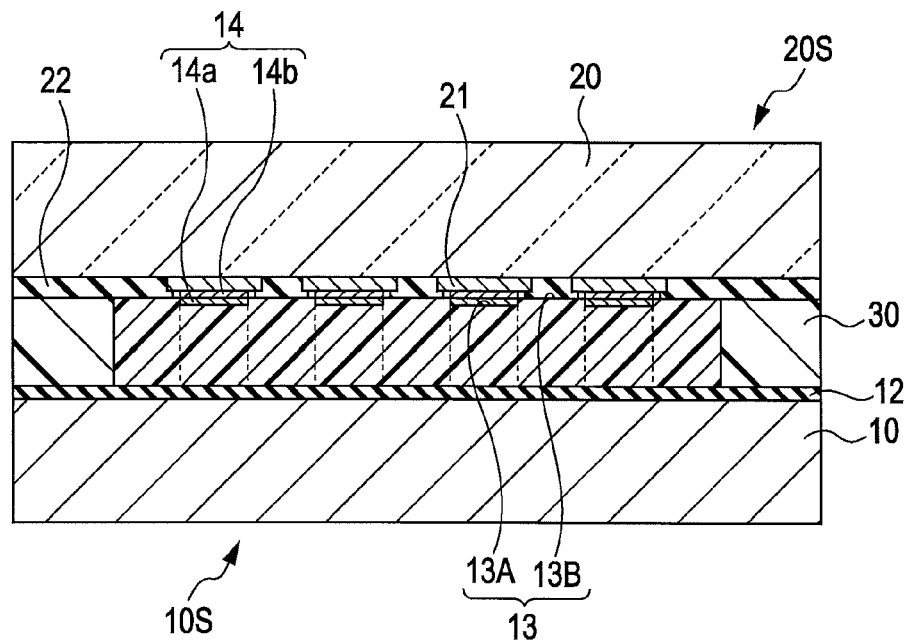
FIG. 5 is a sectional view showing a state after the mounting in the mounting process for the mounting structure.
Figure 6:
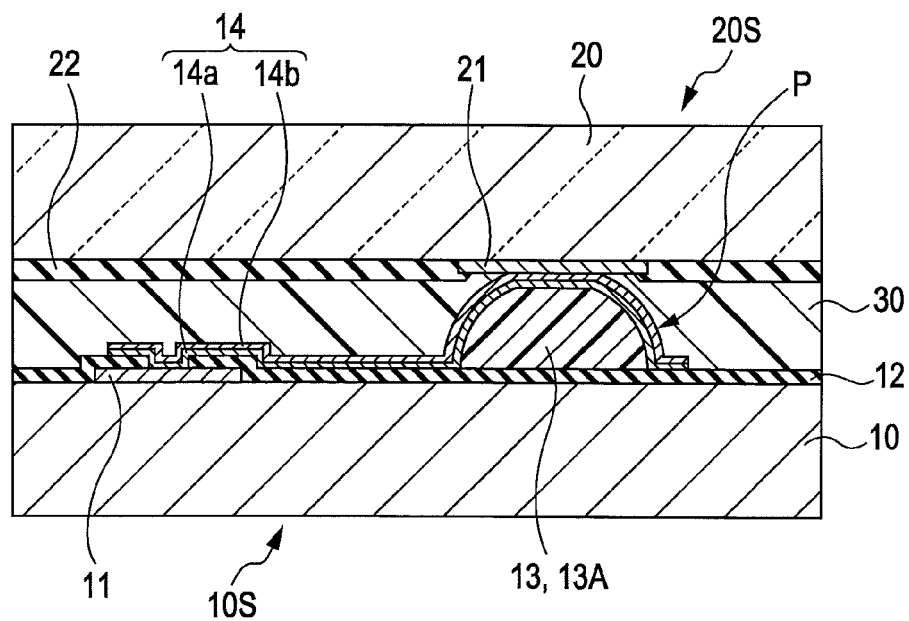
FIG. 6 is a sectional view taken along the electrically conductive layers in a state after the mounting in the mounting process for the mounting structure.

FIG. 5 is a vertical sectional view taken along the direction of extension of the protruding member 13 after mounting the electronic component 10 or the semiconductor device 10S to the different electronic component or the electro-optical panel 20S. FIG. 6 is a vertical sectional view taken along a direction that is perpendicular to the direction of extension of the protruding member 13. Squashing the top portions of the protruding electrodes P by the facing electrodes 21 causes portions other than the top portions of the protruding electrodes P, that is, the second top portions 13B in the embodiment to come into direct contact with the different electronic component or the electro-optical panel 20S, More specifically, the second top portions 13B are in contact with the surface of the insulating layer 22 on the substrate 20.

In the illustrated embodiment, since the surfaces of the facing electrodes 21 are formed on the substrate 20 so as to be lower in height than the surface of the insulating layer 22 formed in the vicinity thereof, the top portions of the protruding electrodes P protrude further than the second top portions 13B even after the mounting. However, since the relationship between the height of the surfaces of the facing electrodes 21 and the height of the surface of the insulating layer 22 is not limited to that mentioned above, the relationship between the top portions of the protruding electrodes P and the second top portions 13B after the mounting changes in accordance with this height relationship. For example, if the height of the surfaces of the facing electrodes 21 and the height of the surface of the insulating layer 22 are the same, the height of the top portions of the protruding electrodes P is the same as the height of the second top portions 13B.

In either case, the second top portions 13B (which are different from the top portions of the protruding electrodes P) are directly (that is, not through the adhesive 30) in contact with the different electronic component or the electro-optical panel 20S in a mounting direction (that is, in a direction in which the protruding electrodes P and the facing electrodes 21 press-contact each other, or in the illustrated vertical direction. Therefore, even if the compression force during the mounting varies, or the elastic modulus of the protruding electrodes P (protruding member 13) varies, it is possible to prevent the protruding electrodes P from becoming cracked. That is, even if the top portions of the protruding electrodes P are squashed and the compression force during the mounting becomes even greater than that when the second top portions 13B lightly contact the different electronic component or the electro-optical panel 20S, the compression force is applied not only to the top portions of the protruding electrodes P, but also to the second top portions 13B. Therefore, further deformation of the top portions of the protruding electrodes P is restricted. Consequently, cracking of the first top portions 13A of the protruding members 13 and the electrically conductive layers 14 (provided on the first top portions 13A), caused by the deformation amount of the top portions of the protruding electrodes P becoming excessive, can be prevented from occurring.

In the mounting structure of the illustrated embodiment, portions other than the top portions of the protruding electrodes P of the semiconductor device 10S or the electronic component, that is, the second top portions 13B are directly in contact with a portion of the different electronic component or the electro-optical panel 20S, that is, the insulating layer 22. However, in the embodiment of the invention, the second top portions 13B do not necessarily have to be brought in contact with the insulating layer 22. That is, they may be mounted with a gap formed between the second top portions 13B and the insulating layer 22. Even in this case, when the electronic component or the semiconductor device 10S is formed as described above, even if the top portions of the protruding electrodes P are further squashed so that their height becomes the same as that of the second top portions 13B, the protruding electrodes P are not cracked. Therefore, even if there are variations in, for example, the elastic modulus of the protruding electrodes P, temperature, and the compression force during mounting, electrical reliability of the mounting structure is guaranteed.

Figure 7:
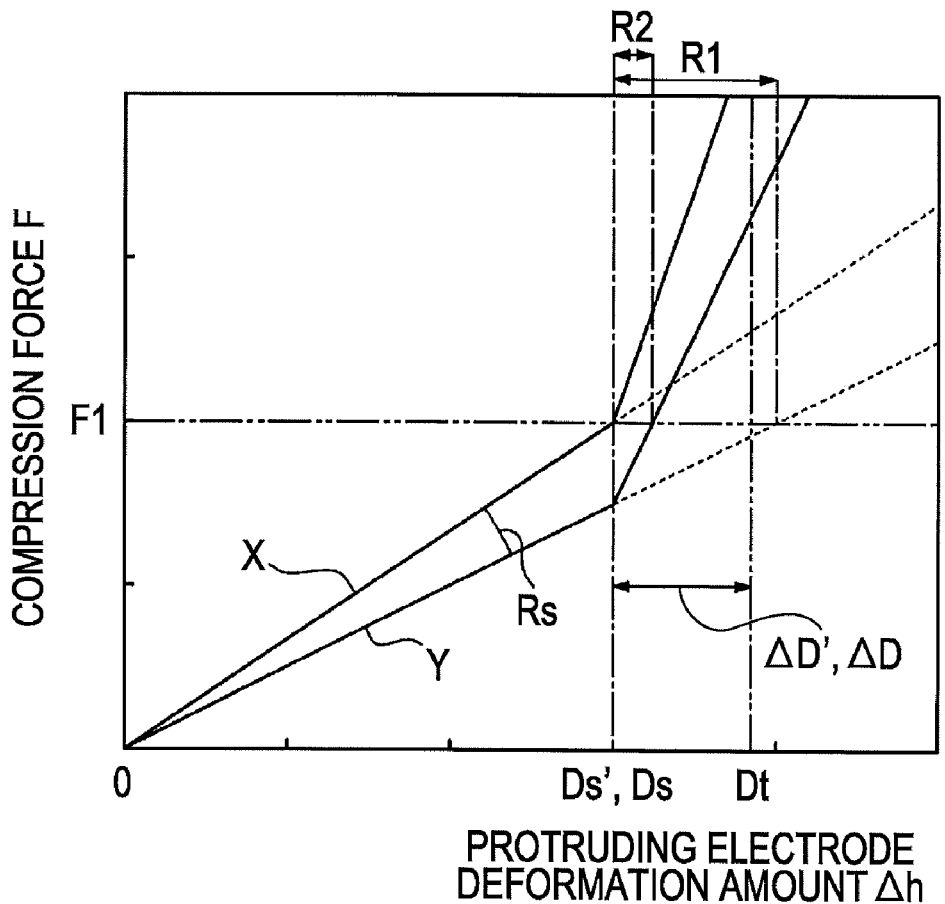
FIG. 7 is a graph showing the relationship between compression force during the mounting and deformation amount of the protruding electrodes.

FIG. 7 is a graph showing the relationship between a compression force F during the mounting and a deformation amount Δh of the protruding electrodes P. Here, variations exist in the actual elastic modulus of the protruding electrodes P Therefore, to indicate the range of variations of the actual elastic modulus, a protruding electrode X having a high elastic modulus and a protruding electrode Y having a small elastic modulus are indicated. In either case, the inclination of a straight line indicating the elastic deformation represents the elastic modulus. An elastic-modulus variation range Rs differs depending upon the circumstances. It depends upon, for example, variations in the form of the protruding electrodes P and variations in the mechanical characteristics of the protruding member 13, and is very difficult to eliminate completely.

In FIG. 7, the equation "deformation amount Δh=Dt" corresponds to a limiting deformation amount when a crack occurs. If the top portions of the protruding electrodes P reach the limiting deformation amount Dt, the probability of the protruding electrodes P becoming cracked is very high. Since the factors that cause a crack are complicated, it is difficult to uniformly determine the limiting deformation amount Dt. Actually, it is possible to determine a substantially proper value experimentally.

In the embodiment, the height difference Ds exists between the top portions of the protruding electrodes P and the second top portions 13B. Therefore, when the deformation amount Δh of the protruding electrodes P becomes a boundary value Ds' corresponding to the height difference Ds, the different electronic component or the electro-optical panel 20S starts to contact not only the top portions of the protruding electrodes P, but also the second top portions 13B. (The boundary value Ds' corresponds to a deformation amount of the top portions of the protruding electrodes P when the second top portions 13B start to directly contact the surface of the insulating layer 22 as the top portions of the protruding electrodes P are squashed. It also matches the height difference Ds if the surface of the different electronic component or the electro-optical panel 20S is completely flat or is considered as being flat at the facing electrodes 21 and in the vicinity thereof.) Therefore, the inclinations of the straight lines indicating the elastic moduli increase suddenly. That is, when the deformation amount Δh exceeds the boundary value Ds', the top portions of the protruding electrodes P are not easily deformed further.

Here, the protruding electrodes P are assumed as those having an average elastic modulus within the elastic-modulus variation range Rs, and the compression force F during the mounting is set to F1. Here, if the height difference Ds between the top portions of the protruding electrodes P and the second top portions 13B is considerably greater than the limiting deformation amount Dt, or if the second top portions 13B are not formed, the actual elastic moduli do not change at the boundary value Ds' as indicated by illustrated dotted lines. Therefore, a range of variation of the deformation amount Δh of the top portions of the protruding electrodes P is R1. In the illustrated embodiment, since a portion that exceeds the limiting deformation amount Dt exists in the variation range R1, the protruding electrodes P may crack.

In contrast, as indicated by illustrated solid lines, when the boundary value Ds' for the top portions of the protruding electrodes P and the second top portions 13B is less than or equal to the limiting deformation amount Dt, the actual elastic moduli increase, so that the range of variation of the deformation amount of the protruding electrodes P becomes R2. Accordingly, the range of variation of the deformation amount of the protruding electrodes is considerably reduced. In the illustrated embodiment, since the range R2 of variation of the deformation amount exists only in a region that is less than the deformation amount Dt, a crack does not occur in the protruding electrodes P.

That is, when the boundary value Ds' is less than the limiting deformation amount Dt, the range of variation of the deformation amount of the top portions of the protruding electrodes P is reduced. Therefore, even if a compression force that can sufficiently provide a contact area between the protruding electrodes P and the facing electrodes 21 is applied, the probability of the protruding electrodes P becoming cracked can be reduced. In addition, from the point where the deformation amount Δh becomes equal to the boundary value Ds', the actual elastic moduli of the top portions of the protruding electrodes P increase suddenly. Therefore, even if the compression force F is set roughly to a certain degree, the deformation amount Δh of the top portions of the protruding electrodes P is stabilized to a value that is close to the boundary value Ds'.

In the description provided with reference to FIG. 7, it is discussed that, even if the compression force F is constant, variations occur in the deformation amount Δh of the protruding electrodes P due to variations in the elastic modulus of the protruding electrodes P. However, for example, variations in the compression force F also similarly cause the variations in the deformation amount of the top portions of the protruding electrodes P as does the variations in the elastic modulus.

Although, in the foregoing description, the boundary value Ds' is used as a reference, the height difference Ds may be used as a reference instead of the boundary value Ds' to provide advantages corresponding thereto. That is, when the structure of the electro-optical panel 20S or the different electronic component at the other end is undetermined, the height difference Ds at the electronic component or the semiconductor device 10S is made less than the limiting deformation amount Dt. In this case, strictly speaking, a different condition occurs depending upon the structure at the other end. However, certain advantages can be provided.

The height difference Ds is determined as follows. First, the relationship between the deformation amount Δh of the protruding electrodes P and the occurrence of, for example, a crack is previously determined by, for example, an experiment or simulation, to determine the limiting deformation amount Dt. Next, the height difference Ds or the boundary value Ds' is set so as to become less than the limiting deformation amount Dt. Here, when the boundary value Ds' is set, the height difference Ds is further determined from the boundary value Ds' on the basis of the structure of the electro-optical panel 20S or the electronic component.

When the top portions of the protruding electrodes P are squashed so that their temperature becomes equal to the softening temperature or the temperature that is the same as that in the mounting process, the limiting deformation amount Dt is determined with reference to whether or not a crack occurs in the protruding electrodes P. That is, the experiment or simulation, which is performed for determining the limiting deformation amount Dt, is carried out so that the experiment is conducted under these temperatures or so that the simulation is performed on the assumption that the protruding electrodes P are at these temperatures. This makes it possible to determine the limiting deformation amount Dt corresponding to the deformation amount of the protruding electrodes P in the actual mounting process.

In the above-described case, a safe deformation amount ΔD, which is the difference between the height difference Ds and the limiting deformation amount Dt, or a safe deformation amount ΔD', which is the difference between the boundary value Ds' and the limiting deformation amount Dt, may be set greater than or equal to a predetermined value. The safe deformation amount ΔD or ΔD' is desirably in the range of from 5% to 50% of the limiting deformation amount Dt, and, more desirably, in the range of from 10% to 30%. When it is less than this range, the probability of, for example, the protruding electrodes P becoming cracked is increased. When it is greater than this range, the deformation amount of the top portions of the protruding electrodes P is not ensured easily. This makes it difficult to provide contact pressure between the protruding electrodes P and the facing electrodes 21. In addition, this increases the improbability with which sufficient contact area can be provided between the protruding electrodes P and the facing electrodes 21.

When the limiting deformation amount Dt is determined on the basis of experimental results, and variations occur in values of the deformation amount P of a cracked protruding electrode P, the variations are quantified by a suitable method to determine the limiting deformation amount so as to allow safe mounting even if variations exist. For example, it is possible to determine a distribution of the aforementioned values, and to set, as the limiting deformation value Dt, a value at which a crack occurrence probability is predeterminately sufficiently small. Obviously, the experimentally obtained minimum value of the deformation amount of cracked protruding electrode P may be used as the limiting deformation amount Dt.

Structure of Mounting Structure and Electro-Optical Device

Figure 8:
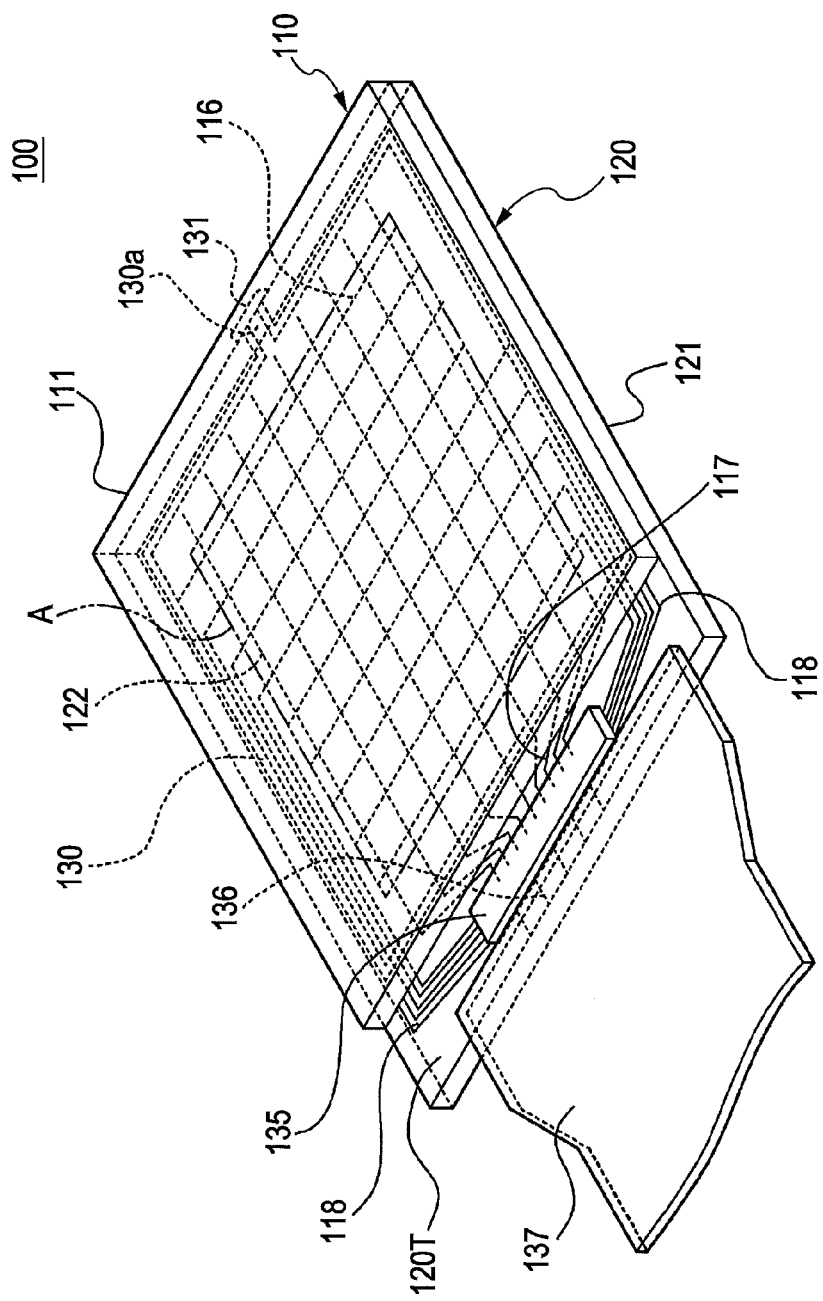
FIG. 8 is a schematic perspective view of an exemplary electro-optical device.

Next, a mounting structure and an electro-optical device according to an embodiment of the invention will be described in detail with reference to FIG. 8. As shown in FIG. 8, an electro-optical device 100 according to the embodiment is a liquid crystal device including a liquid crystal display member (liquid crystal panel) and is formed by adhering transparent substrates 110 and 120, formed of, for example, glass, to each other with a sealant 130, and placing liquid crystals between the substrates 110 and 120. The sealant 130 is formed so as to surround a drive area A, and an opening 130a into which the liquid crystals are injected is closed by a sealing material 131.

At the substrate 110, for example, a reflecting layer, a color filter, an insulating film, electrodes 116, and an alignment film are laminated, as appropriate, on an inner surface of a base member 111 formed of, for example, glass or plastic. The reflecting layer is formed of a metal, such as Al or Ag, or other reflecting materials. The electrodes 116 are formed of transparent electrically conductive materials such as indium tin oxide (ITO). The alignment layer is formed of, for example, polyimide resin.

At the substrate 120, for example, a wire 122, an element connected to the wire 122, an insulating layer, electrodes, and an alignment film are laminated, as appropriate, on an inner surface of a base member 121 formed of, for example, glass or plastic. The element is a two-terminal non-linear element, such as TFD, or a three-terminal non-linear element, such as TFT. The electrodes are formed of transparent electrically conductive materials. The alignment layer is formed of, for example, polyimide resin.

Areas where the electrodes provided on the substrate 110 and the electrodes provided on the substrate 120 intersect each other in plan view constitute pixels at which the alignment state of the liquid crystals interposed between the electrodes can be independently controlled. In the illustrated drive area A, the pixels are arranged vertically and horizontally.

The substrate 120 has a substrate protrusion 120T protruding outward from the external form of the substrate 110. A semiconductor device 135 incorporating, for example, a liquid crystal drive circuit is mounted to the substrate protrusion 120T The semiconductor device 135 is electrically conductively connected to the electrodes 116 and the wire 122, and to wires 117 and 118 that are led out on the substrate protrusion 120T. An input terminal 136, electrically conductively connected to the semiconductor device 135, is provided at an end of the substrate protrusion 120T, and is electrically conductively connected to a wire (not shown), formed on a wiring substrate (such as a flexible wiring substrate) 137 mounted to the end of the substrate protrusion 120T A spacer (not shown), formed of, for example, an adhesive, is interposed between the substrates 110 and 120, and regulates the interval between the substrates. It is desirable that the spacer be formed while fixed to either one of the substrates. Further, if necessary, retardation films and polarizers (not shown) are disposed on external surfaces of the substrates 110 and 120 by, for example, attaching them.

The protruding electrodes P, formed at the electronic component (semiconductor device) according to the embodiment, are formed at the above-described semiconductor device 135. The protruding electrodes P are electrically conductively connected to facing electrodes (connecting pads), provided at ends of the wires 117 and 118 provided on the substrate protrusion 120T. In this case, similarly to the above-described case, the semiconductor device 135 is heated while being compressed with respect to the substrate protrusion 120T through an adhesive formed of thermosetting resin. Then, while softening the adhesive, the protruding electrodes P are pushed against the facing electrodes to deform the top portions of the protruding electrodes P. Thereafter, the adhesive is subjected to thermosetting to maintain an electrically conductive connection state between the protruding electrodes P and the facing electrodes.

The structure and method of mounting the semiconductor device 135 and the substrate protrusion 120T are as illustrated in FIGS. 4 to 6 and as described above with reference to these figures. In the embodiment, the semiconductor device 135, which is an electronic component, and the mounting structure, which includes an electro-optical panel, are formed. In addition, the structure of the mounting structure is assumed as including the aforementioned protruding electrodes P. For example, it is possible to mount the semiconductor device 135 (first electronic component) according to the embodiment to the wiring substrate (for example, a flexible wiring substrate), which is a different electronic component (second electronic component), as a result of which the wiring substrate is mounted to the substrate protrusion 120T of the electro-optical panel.

Electronic Apparatus

Figure 9:
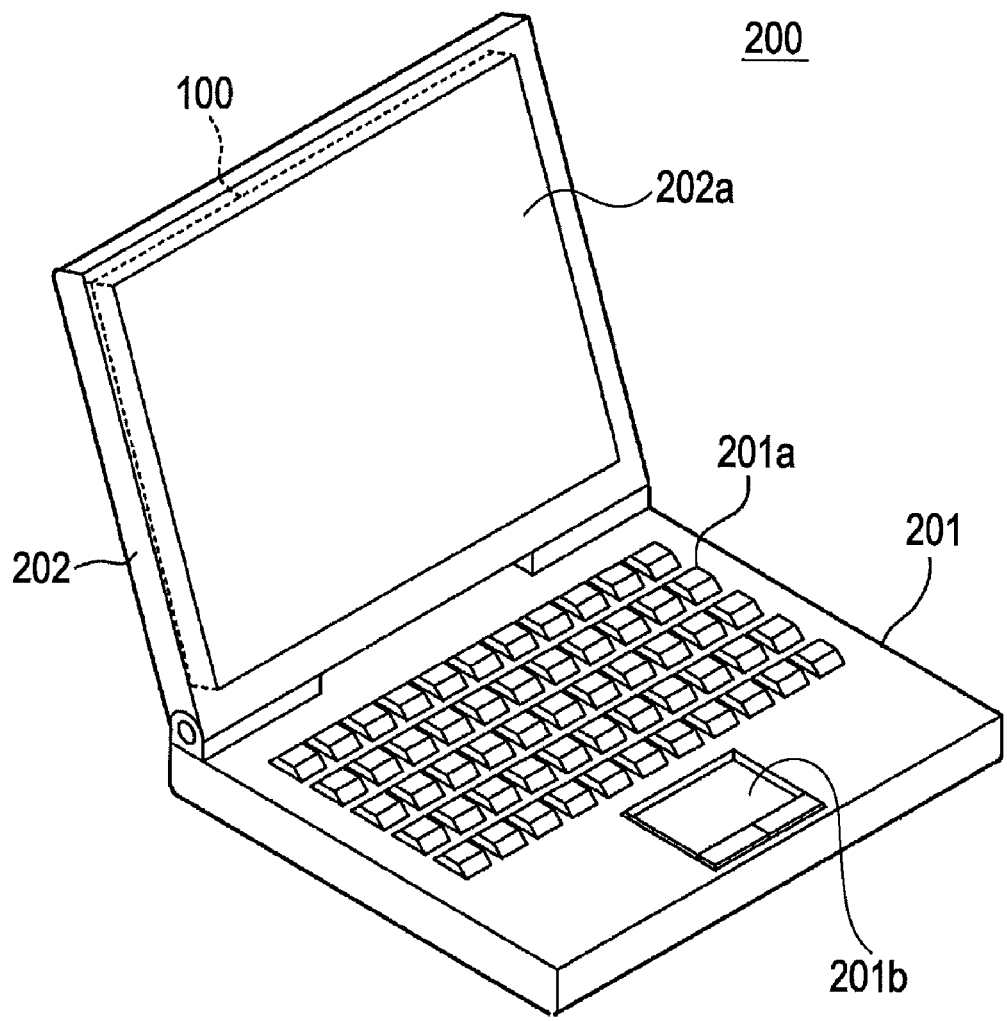
FIG. 9 is a schematic perspective view of an exemplary electronic apparatus.

Lastly, an embodiment in which the electro-optical device 100 is installed in an electronic apparatus will be described. FIG. 9 shows a notebook personal computer, which corresponds to the electronic apparatus according to the embodiment of the invention. The personal computer 200 includes a body 201 and a display unit 202. The body 201 has a plurality of operating buttons 201*a* and another operating unit 201*b*. The display unit 202 is connected to the body 201 and includes a display screen 202*a*. In the illustrated embodiment, the body 201 and the display unit 202 can be opened and closed. The aforementioned electro-optical device (liquid crystal device) 100 is installed in the display unit 202. A predetermined display image is displayed on the display screen 202*a*. In this case, a display control circuit, which controls the electro-optical device 100, is provided in the personal computer 200. This display control circuit is formed so that it transmits a predetermined control signal to the drive circuit (such as a liquid crystal drive circuit), provided in the semiconductor device 135 of the electro-optical device 100, as a result of which a display mode is determined.

In addition to the electronic apparatus shown in FIG. 9, other electronic apparatuses include a liquid crystal television, a car navigation system, a pager, an electronic notebook, a calculator, a work station, a television telephone, and a POS terminal. The electro-optical device according the embodiment of the invention can be used as the display unit of these various electronic apparatuses.

The mounting structure, the electro-optical device, the electronic apparatus, and the method of producing the mounting structure according to the invention are not limited to the illustrated embodiments above. Obviously, various modifications can be made without departing from the gist of the invention.

Although, in the foregoing description, a protruding member having top portions, such as the first top portions 13A and the second top portions 13B, is described, the invention is not limited thereto. That is, the protruding member 13 may include first areas (first top portions), having electrically conductive layers provided thereon, and second areas (second top portions), not having electrically conductive layers provided thereon. Here, the first areas of the protruding member 13 are squashed more than the second areas. According to this structure, when each first area is squashed during mounting, each first area is easily squashed and squashing force is reduced as a result of support by each second area. Therefore, for example, the occurrence of cracking of the protruding electrodes can be reduced. Consequently, for example, variations and an increase in connection resistance resulting from, for example, cracking, caused by the protruding electrodes becoming squashed more than is necessary, are reduced. As a result, electrical reliability can be increased.

What is claimed is:

1. A mounting structure comprising:
a first electronic component including at least one protruding electrode including a protruding member and at least one electrically conductive layer, the protruding member being formed of resin, the at least one electrically conductive layer being disposed on the protruding member;

a second electronic component having a facing electrode electrically conductively in contact with the at least one protruding electrode; and
an adhesive used to adhere the first electronic component and the second electronic component to each other,
wherein the protruding member has a first area and a second area, the first area having the at least one electrically conductive layer provided thereon, the second area not having the at least one electrically conductive layer provided thereon, the first area and the second area each adhering to the second electronic component in the state of being squashed, and
wherein a deformation amount in a height direction of the protruding member at the first area is larger than a deformation amount in the height direction at the second area, in the state of being squashed.

2. The mounting structure according to claim 1, wherein, by squashing the first area of the protruding member more than the second area, the second area directly contacts the second electronic component in a direction in which the at least one protruding electrode and the facing electrode contact each other.

3. The mounting structure according to claim 1, wherein the at least one protruding electrode includes a plurality of protruding electrodes, the at least one electrically conductive layer includes a plurality of electrically conductive layers, the first electronic component includes the plurality of protruding electrodes, the plurality of protruding electrodes include the common protruding member and the plurality of electrically conductive layers provided at the first area of the common protruding member so as to be separated from each other by the second areas.

4. The mounting structure according to claim 1, wherein there is a difference between the height of the first area of the protruding electrode and the height of the second area which is less than the height of the first area, and the height difference is set in a range in which the protruding electrode is not cracked when a top portion of the protruding electrode is squashed from above until there is no height difference at a softening temperature before hardening of the adhesive.

5. An electro-optical device comprising:
an electronic component including at least one protruding electrode including a protruding member and at least one electrically conductive layer, the protruding member being formed of resin, the at least one electrically conductive layer being disposed on the protruding member;
an electro-optical panel having a facing electrode electrically conductively in contact with the at least one protruding electrode; and
an adhesive used to adhere the electronic component and the electro-optical panel to each other,
wherein the protruding member has a first area and a second area, the first area having the at least one electrically conductive layer provided thereon, the second area not having the at least one electrically conductive layer provided thereon, the first area and the second area each adhering to the electro-optical panel, in the state of being squashed, and
wherein a deformation amount in a height direction of the protruding member at the first area is larger than a deformation amount in the height direction at the second area, in the state of being squashed.

6. The electro-optical device according to claim 5, wherein, by squashing the first area of the protruding member more than the second area, the second area directly contacts the electro-optical panel in a direction in which the at least one protruding electrode and the facing electrode contact each other.

7. The electro-optical device according to claim 5, wherein the at least one protruding electrode includes a plurality of protruding electrodes, the at least one electrically conductive layer includes a plurality of electrically conductive layers, the electronic component includes the plurality of protruding electrodes, the plurality of protruding electrodes include the common protruding member and the plurality of electrically conductive layers provided at the first area of the common protruding member so as to be separated from each other by the second areas.

8. The electro-optical device according to claim 5, wherein there is a difference between the height of the first area of the protruding electrode and the height of the second area which is less than the height of the first area, and the height difference is set in a range in which the protruding electrode is not cracked when a top portion of the protruding electrode is squashed from above until there is no height difference at a softening temperature before hardening of the adhesive.

9. An electronic apparatus comprising:
the mounting structure of claim 1.

10. An electronic apparatus comprising:
the electro-optical device of claim 5.

* * * * *